(12) United States Patent
Andersen et al.

(10) Patent No.: US 6,434,076 B1
(45) Date of Patent: Aug. 13, 2002

(54) REFRESH CONTROL CIRCUIT FOR LOW-POWER SRAM APPLICATIONS

(75) Inventors: John E. Andersen, Essex Junction, VT (US); Louis L. Hsu, Fishkill, NY (US); Stephen Kosonocky, Darien, CT (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/766,799

(22) Filed: Jan. 22, 2001

(51) Int. Cl.$^7$ .................................................. G11C 8/00
(52) U.S. Cl. ........................ 365/222; 365/156; 365/226
(58) Field of Search ................................. 365/222, 156, 365/226, 229, 228

(56) References Cited

U.S. PATENT DOCUMENTS 5,047,987 A * 9/1991 Kosuge ...................... 365/228
5,204,840 A * 4/1993 Mazur ........................ 365/228
5,428,252 A * 6/1995 Walker ....................... 369/229

* cited by examiner

*Primary Examiner*—Amir Zarabian
(74) *Attorney, Agent, or Firm*—Scully, Scott, Murphy & Presser; Robert M. Trepp, Esq.

(57) ABSTRACT

A power management circuit for an SRAM system including one or more isolated memory arrays and implementing a power source including a local power supply associated with each memory array and an external power supply connected to local supplies during an active mode of operation. The power management circuit comprises: a switch mechanism for disconnecting the external power supply to each of local power supply during a low power mode of operation; and, a refresh timing circuit implementing memory array refresh operation by selectively connecting the external power supply to a respective local power supply during the low power mode. During the low power mode, the refresh circuit intentionally enables the local power supply to float and allow it to drift to a lower predetermined voltage level prior to the memory array refresh operation.

26 Claims, 7 Drawing Sheets

LOW-POWER SRAM WITH DYNAMIC ARRAY REFRESH SCHEME

SCHEMATIC OF POWER MANAGEMENT CIRCUIT

LAYOUT OF POWER MANAGEMENT CIRCUIT FOR EACH SUB-ARRAY

SRAM REFRESH CONTROL CIRCUIT

SRAM CELL SCHEMATIC

WAVEFORMS OF DYNAMIC ARRAY PRECHARGE

A NEW SRAM POWER MANAGEMENT CIRCUIT

WAVEFORMS OF THE SRAM REFRESH CONTROL OPERATION

SLEEP ACTIVATED J-K FLIP-FLOP

SCHEMATIC OF POWER MANAGEMENT CIRCUIT

STATIC INTERNAL Vdd CLAMP TECHNIQUE

Vdd CURRENT SUPPLY

REFRESH CONTROL CIRCUIT FOR LOW-POWER SRAM APPLICATIONS

BACKGROUND OF THE INVENTION

1. Field of the Invention

This invention relates generally to memory systems, and more specifically, a low power static random access memory (SRAM) system including a power management scheme implementing a novel, robust refresh control circuit for enabling significantly reduced low power operation.

2. Discussion of the Prior Art

SRAM, or static random access memory, due to its high-performance nature, is widely used in computer systems. As the density of the SRAM is further improved along with the scaling of the technology, the SRAM memory chips, or embedded macros are also widely adopted in the hand-held systems, such as cell phone, personal digital assistants (PDA), global positioning systems (GPS), especially for L1 or L2 cache. The design of SRAM is simpler than that of dynamic random access memory (DRAM) systems in that the data stored in the array are latched in the cells and no refresh is required. SRAM is additionally faster than DRAM, since all the read operations are nondestructive, no write back or bit-line pre-charge period is required. Recently, a 4-T SRAM cell has been proposed by NEC to further reduce the SRAM size. Normally, SRAM cell efficiency (i.e., the area ratio of array to the whole chip) is higher than that of DRAM. Area overhead such as on-chip generator system, refresh unit, redundancy and complex BIST are absent from SRAM circuits.

However, the biggest concern for SRAMs to be used for low-power systems is the stand-by current from the arrays when they are idle. The power supply to the SRAM array must be maintained during the low-power modes, e.g., sleep and stand-by modes, or otherwise, the data stored in the array will be lost. Some prior art systems have addressed this problem by shutting off the portion of the array that is not in use. This method relies on the system to decide which part of the array is in use, and to switch off the array that is not needed in the low-power mode. This also requires a large area for placing the switch device, since every row needs a switch to selectively turn it off. As proposed by M. Powell, from Purdue University in the digest paper entitled "Gated-Vdd: A Circuit Technique to Reduce Leakage in Deep Sub-Micron Cache Memory" published by the International Symposium on Low-Power Electronic Design (ILPED 2000 pages 90–95), a switch to shut off the row may degrade the SRAM performance if it is not properly sized. Additionally, a complex decoding and switch circuit to shut off the rows is required. This approach is especially not effective when a small SRAM is used, and when most of the array is needed for data storage during the low-power mode, e.g., when SRAMs are to be used for cache applications.

The concept of low-power SRAM using a refreshable array scheme has been proposed. The power saving of the refreshable SRAM array during stand-by is significant, especially when the array is large and stand-by period is long. Use of a conventional DRAM-like refresh circuit that is able to perform the refreshing of local supplies, and SRAM cells, is not very desirable in that such a solution is typically (1) bulky in size, (2) consumes a larger power overhead, and (3) requires an initial test to set the refresh timing.

It would be highly desirable to provide a power management circuit to minimize the power consumption of SRAM arrays especially during the low-power modes of operation.

It would be further highly desirable to provide a new and robust refresh circuit that is relatively smaller than those implemented in DRAM circuits, and that obviates the need of conventional clock generator for the refresh timing.

It would be further highly desirable to provide a new and robust refresh circuit that where the refresh timing is generated directly from the internal or local voltage supply.

SUMMARY OF THE INVENTION

It is an object of the present invention to provide a power management circuit to minimize the power consumption of SRAM arrays especially during the low-power mode.

It is a further object of the present invention to implement a refresh timing circuit similar to that of DRAMs to conduct refresh to the internal (local) voltage supply of the SRAM arrays, however implements a novel refresh timing mechanism that is generated directly from the local voltage supply.

According to the principles of the invention, there is provided a power management circuit for an SRAM system including one or more memory arrays and implementing a power source including a local power supply associated with each memory array and an external power supply connected to each local power supply during active mode of operation, the power management circuit comprising: a switch mechanism for disconnecting the external power supply to each of local power supply during a low power mode of operation; and, a refresh timing circuit implementing memory cell refresh operation by selectively connecting the external power supply to a respective local power supply during the low power mode, wherein, during the low power mode, the refresh circuit intentionally enables the local power supply to float and drift to a lower predetermined voltage level prior to the memory cell refresh operation.

In a further embodiment, there is implemented a refresh timing circuit similar to that provided in DRAM circuits to conduct refresh to the local power supply of the SRAM arrays. Particularly, in accomplishing improved low power operation, a soft-refresh to the SRAM arrays and the local power supply is implemented. The SRAM arrays are further partitioned into multiple of sub-arrays with ground buses used to isolate the sub-arrays. To optimize the power saving, a test algorithm is proposed to determine the optimum SRAM array refresh cycle time which is programmable by fuse elements in the power management circuit.

Advantageously, detrimental noise coupling effects are avoided while SRAM arrays are in the low-power mode to prevent the possibility of lost data.

BRIEF DESCRIPTION OF THE DRAWINGS

Further features, aspects and advantages of the apparatus and methods of the present invention will become better understood with regard to the following description, appended claims, and the accompanying drawings where:

DETAILED DESCRIPTION OF THE PREFERRED EMBODIMENTS

Figure 1:
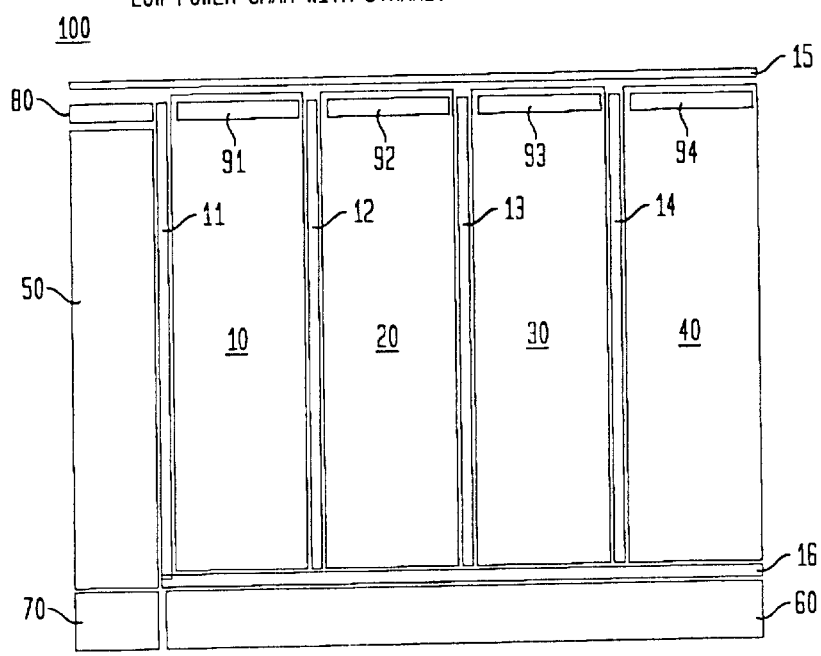
FIG. 1 is a circuit diagram illustrating the low-power SRAM block 100 with dynamic array refresh scheme according to the invention.

According to the invention, there is provided an exemplary depiction of a low-power SRAM circuit 100 with dynamic array refresh scheme according to the principles of the invention. As shown in FIG. 1, the SRAM circuit 100 comprises four sub-arrays 10, 20, 30 and 40, with each sub-array including a respective power management unit, 91, 92, 93 and 94 which decides and controls when each respective sub-array is to be connected to a major power supply, i.e., Vdd 15. The SRAM circuit 100 further includes row decoder and word-line drivers 50, pre-decoder, and control block circuitry 70, and, sense-amplifiers, column switches, column decoders, and I/O drivers 60. A novel refresh control circuit 80 that generates refresh cycle time for the power management unit is additionally provided as will be discussed in greater detail herein. Further included is the major Vdd power supply 15 that powers each array, and ground buses 11,12,13,14 and 16 that isolate each of the arrays from each. As will be described in greater detail, the SRAM sub-arrays may be refreshed simultaneously or, one at a time. The provision of the ground busses acts to minimize any coupling from the neighboring array during refresh.

Figure 2:
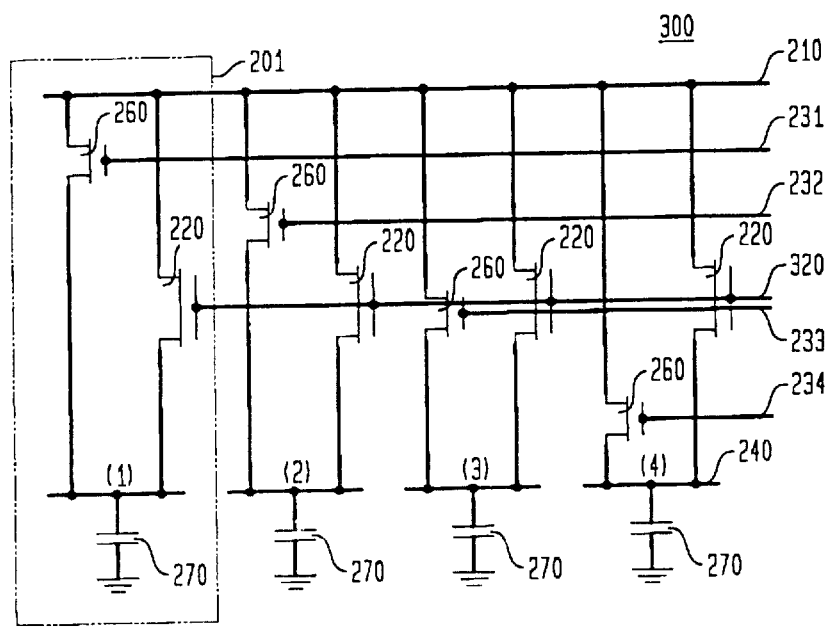
FIG. 2 illustrates a circuit schematic of the power management circuit for the SRAM circuit of the invention.
Figure 3:
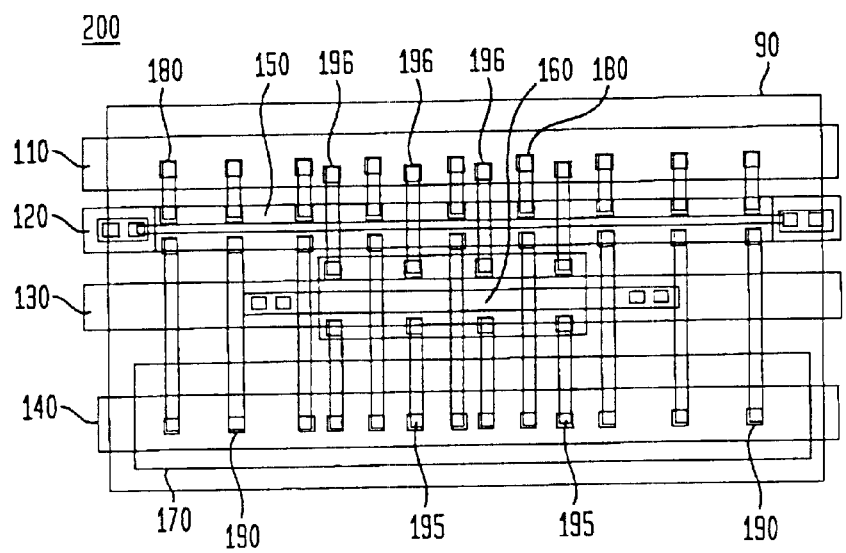
FIG. 3 depicts the layout of the power management circuit 200 for an SRAM sub-array circuit of the invention.

FIG. 2 illustrates a circuit schematic of the power management circuit for the SRAM circuit of the invention. As shown in FIG. 2, the power management circuit 300 supplies power from a major power supply source 210 to each sub-array, i.e., labeled sub-army (1), (2) (3) and (4). Preferably, the power management component for each of the sub-arrays comprises two sets of switches: a first set of switches 220 which are large size MOS devices that are used to connect to four sub-arrays and are fully turned on during the active mode operation (i.e., not in sleep mode), and 2) a second set of smaller switch devices 260 are used to refresh each of the internal supplies 240 to each of the sub-array (1), (2) (3) and (4) during the non-active mode (or sleep mode). The switches 260, 220 for a respective sub-array is referred to as a switch unit 201 such as the one shown corresponding to memory sub-array (1) an example layout of which is illustrated in FIG. 3. To avoid a threshold voltage drop, it is desirable that pMOS devices are used for each first switch device 220. To avoid a power surge, one internal supply maybe refreshed for a sub-array individually one at a time. However, for the soft-refresh, power surge is not a concern, and all sub-arrays may be refreshed simultaneously. As will be described in greater detail hereinbelow, a refresh control circuit, like a DRAM system, implements a refresh clock generator to provide the controls to each refresh switch. As shown in FIG. 2, the refresh control circuit generates respective switch control signals 231, 232,233 and 234, for controlling second set transistors 260 of each respective sub-array (1), (2), (3) and (4). Further, the power management circuit of FIG. 2 includes a respective reservoir capacitor 270 attached to the internal power supplies 240. These capacitors 270 are used to temporarily supply a charge for replenishing any leaky arrays so that a refresh period may be reasonably long. This acts to further facilitate power savings. The switches 220, 260 for a respective sub-array are referred to as a switch unit 201 as shown corresponding to memory sub-array (1) with an example layout illustrated in FIG. 3.

Particularly, FIG. 3 illustrates the layout of the power management circuit 200 for an SRAM sub-array circuit of the invention. As shown in FIG. 3, a major power supply that feeds the SRAM array is a wide metal bus 110 which connects to the source of a pMOS device 150 via a group of conductors 180. The drain of the pMOS device is connected to the internal supply bus 140 via another group of metal conductors 190. This pMOS switch with a gate 120 (corresponding to switch 220 in FIG. 2) is a very wide device to ensure that the "on"-resistance will be low. During the active mode, the switch is activated by a control "not-sleep" or "sleep-bar" signal applied to gate 120. During the active mode, the power supply to the array should have as lowest resistance as possible so not to degrade the SRAM's performance. As further shown in FIG. 3, the second switch for this sub-array 160 (corresponding to switch 260 in FIG. 2) may also be a pMOS device, however, preferably, is a very small device, with device width ranging from about 1.0 $\mu$m to 5.0 $\mu$m. The reason that a small device is used is to ensure a "soft" switch, and thus "soft-refresh" during SRAM array refresh, as will be described in greater detail herein. Soft-refresh is understood to mean bringing of the internal supply voltage back to a predetermined high-level at a low-rate to avoid coupling noise. The gate of the smaller switch 160 is controlled by a control signal 130 from the refresh control circuit. During the sleep mode, the supply to each sub-array will be refreshed simultaneously, or sequentially. Similarly, the source of the switch pMOS device 160 is connected to the external supply via a group of conductors 196, and the drain of the switch pMOS device 160 is connected to the local supply via conductors 195. The reservoir capacitor 170 as laid out in FIG. 3, is preferably a gate oxide capacitor, trench capacitor or any other on-chip, low-cost capacitor.

Figure 4:
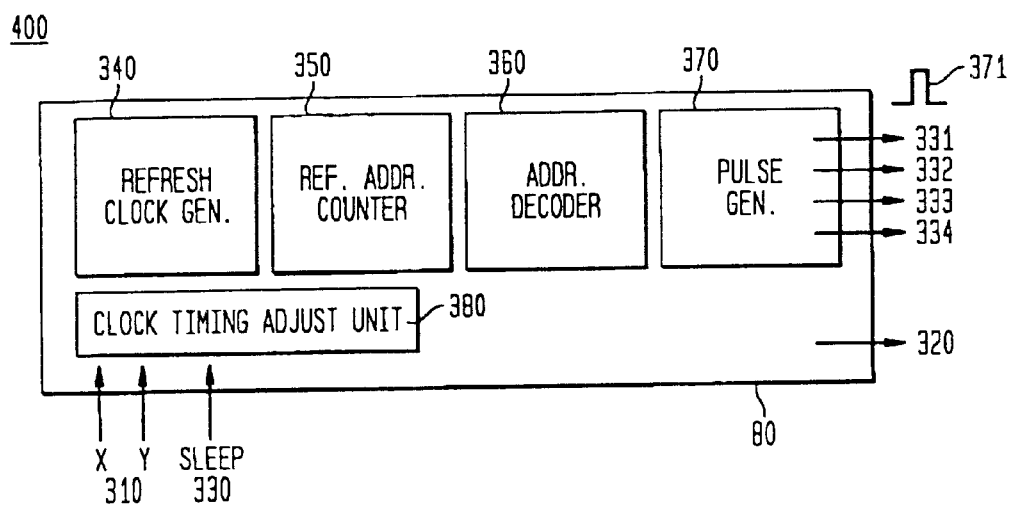
FIG. 4 is a diagram illustrating an example SRAM refresh control circuit 400 according to the invention.

FIG. 4 is a block diagram of an example of SRAM refresh control circuit 400 (or 80 in FIG. 1) according to a first embodiment of the invention. As shown in FIG. 4, the SRAM refresh control circuit 400 comprises a refresh clock generator 340, a refresh address counter 350, an address decoder 360, a pulse generator 370, and a clock timing adjustment unit 380. In general, these components function as those used for generating refresh pulse for a DRAM array circuit. For instance, the refresh clock generator 340 may comprise an RC timer circuit for producing a coarse timing signal to refresh the internal supply with the understanding that the refresh timing is dependent upon the resistor and capacitor sizes of the RC timer. Depending on the technology, and the selected array size, the SRAM refresh period may range anywhere between about 1 $\mu$s to 100 $\mu$s. The clock timing adjust unit 380 provides a timing adjustment by enabling programming of fuses during a test mode.

Once the timing is set, the counter 350 and decoder 360 circuits function to refresh the array, or indicate which local supply needs to be refreshed. While refreshing the local supply, the true and complement nodes of cells in the corresponding array are differentiated. The pulse generator circuit 370 functions to generate a refresh pulse 371 having a pulse width, for example, ranging anywhere from about 1 ns to 100 ns. If the whole array is refreshed at once, then the counter and decoder are not needed. The output signals 331, 332, 333 and 334 of the SRAM refresh control circuit 400 are input as the four switch control signals 231, 232, 233 and 234, and are generated in the sleep mode to sequentially switch transistor devices 260 of each respective sub-array (1), (2), (3) and (4) (as shown in FIG. 2). The SRAM refresh control circuit 400 additionally generates a control signal 320 which functions to switch on/off each of the first switch devices 220 which connect the major supply to the local supplies during the active mode. As shown in FIG. 4, the refresh control circuit 400 receives a 2-bit input control signal 310 that is decoded to determine which of the sub-arrays, e.g., sub-arrays (1)–(4), are to receive the respective control signal 331–334 used to activate the refresh operation during sleep mode. A "sleep" control signal 330 is used to activate the whole refresh control circuit.

Figure 5:
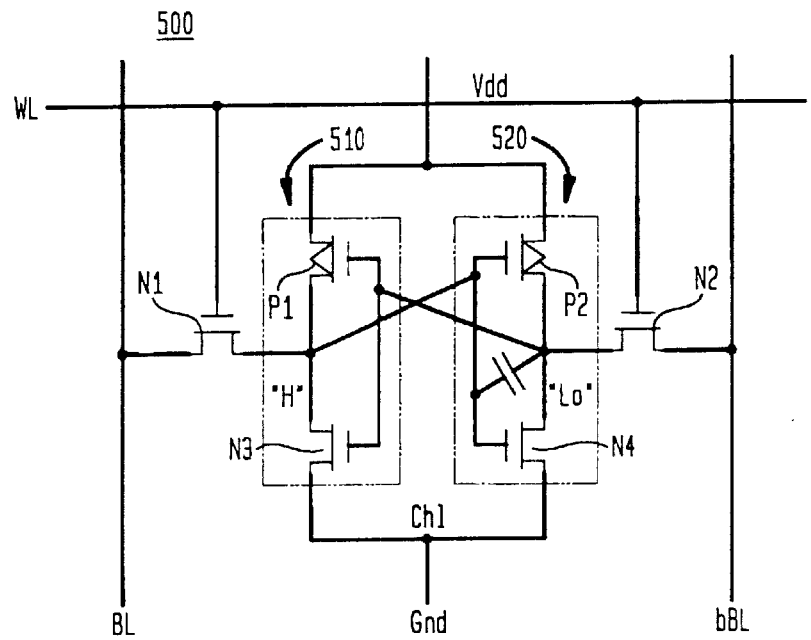
FIG. 5 is a schematic diagram illustrating a conventional 6-T SRAM cell.

As known, it is imperative that the data stored in the SRAM array experience minimum coupling from the environment during an SRAM refresh operation is that, i.e., the differential data bits stored in the internal nodes of a SRAM cell be correctly restored when a refresh operation is finished. FIG. 5 is a schematic diagram illustrating a conventional 6-T SRAM cell 500 which is formed by two back-to-back inverters 510, 520 and two transfer gates N1 and N2, with a first inverter 510 formed by pMOS transistor P1 and nMOS transistor N3, and a second inverter 520 formed by pMOS transistor P2 and nMOS transistor N4. The gates of the transfer devices N1 and N2 are connected to a word-line. The source of the transfer gate N1 is connected to a bit-line BL, and the transfer gate N2 is connected to a complimentary bit-line bBL. The power supply to the cell is coming from Vdd line via the sources of each pull-up pMOS device of the inverters 510, 520. The sources of the NMOS devices of the inverters are connected to ground. As shown in FIG. 5, in operation, when the internal node of the inverter 510 is a high or logic "1" state, e.g., 1.2V, the inverter 520 is a "Low" state, e.g. 0V. If power is suddenly removed from the supply, the "high" node will drift lower due to the channel leakage of the pull-down N3 devices. If bit-lines are pre-charged to a high voltage level, then channel leakage via the transfer device N2 will also occur. Furthermore, the voltage "low" state will become higher due to charge leakage from bBL. When the voltage level of the high state drifts lower than certain value, and the voltage level of the low state drifts higher than a certain value, the latched data is no longer valid. Therefore, for such refresh operation, it must be decided at which low voltage level the internal supply must be refreshed.

As known from the DRAM read operation, as long as a delta signal, i.e., the differential voltage maintained at the internal nodes of the cell is maintained above 100 mV, it is safe to differentiate the high and low data using the latch-type sense amplifier. For a more conservative approach, the Low-Vdd level may be set to achieve a delta higher than 100 mV minimum delta and ranging anywhere from about 100 mV to 300 mV minimum delta. Furthermore, it is advantageous to intentionally provide a built-in capacitor ($C_{h1}$) linking between two-internal nodes of SRAM cells so that noise margin may be significantly improved due to coupling effect.

Figure 6:
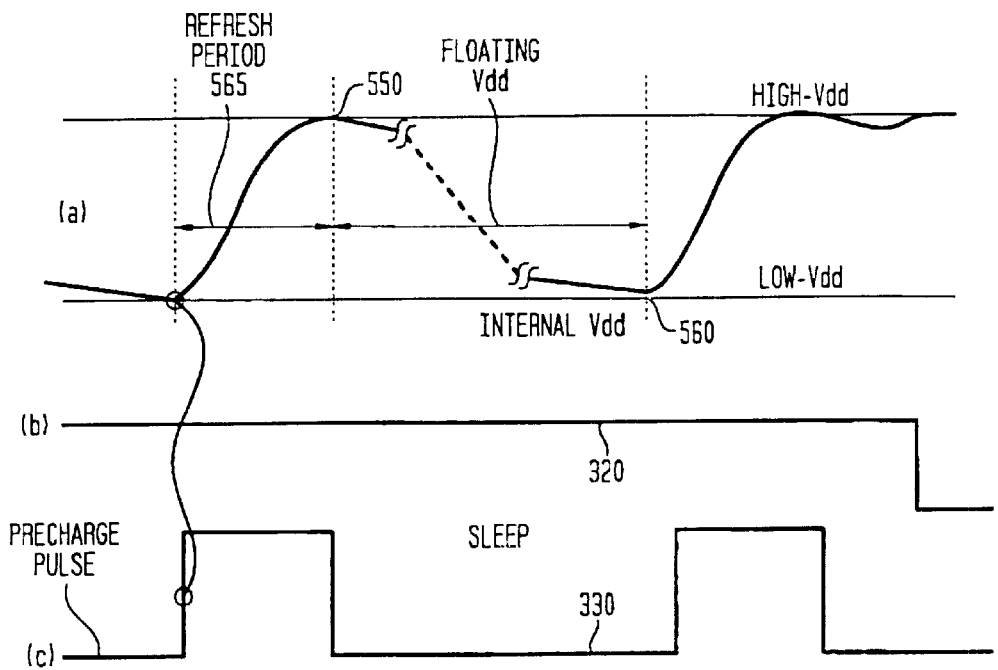
FIGS. 6(a)–6(c) illustrates voltage waveform diagrams relating to the dynamic array precharge in accordance with the principles of the invention.

FIGS. 6(a)–6(c) illustrates voltage waveform diagrams relating to the dynamic array precharge operation in accordance with the principles of the invention. It is desirable that the ramp up rate of the internal Vdd refresh is not too rapid, i.e., soft, in order to avoid the noise coupling effect. As shown in FIG. 6(a), the internal Vdd node of a static SRAM cell is first pre-charged to a level High-Vdd, at 550 and after reaching this voltage level, is left floating until it hits the Low-Vdd level, at 560. During a test mode, the SRAM array is written with all high data, and the time period for the Vdd to drift to the lowest Low-Vdd level is measured. This time is then programmed in the refresh timer circuit for the periodic internal power supply low power mode refresh operation. When the sleep mode is over, the internal Vdd level is restored to the full High-Vdd level.

It should be understood that by changing the size of the switch, the ramp up rate of the internal voltage supply level during a "refresh period" 565 is controlled. In one example, a 10.0 ns to 100.0 ns period refresh pulse-width may be used for each 1000 ns to 1500 ns refresh period. As small as a 1.0 $\mu$m wide of MOS switch may be needed to perform the "soft refresh". It is determined that a 1.0 $\mu$m wide MOS switch device is sufficient for a 250 k of sub-array, since during a refresh period, the Low-Vdd level may be at 200 mV–300 mV and still achieve a conservative delta. The stand-by power comparison between this refresh scheme and a no-refresh conventional one is 3.2 $\mu$A versus 26 $\mu$A, for a 250 K array. This doesn't include the power used to perform the refresh, which is about 20 $\mu$A. Therefore, for a larger array, using 4M as an example (i.e., equal to sixteen 250 K sub-arrays), by implementing this method, the SRAM array stand-by current may be reduced from 416 $\mu$A to 71.2 $\mu$A (51.2 $\mu$A+20 $\mu$A) or about an 83% saving of leakage current for a 4M SRAM. When combined with a mechanism for disengaging the unused SRAM portion, the saving will be even more significant. Further power savings will result by preventing refresh operation to those sub-array portions known to be not in use during a low-power mode.

According to the preferred embodiment, a new and robust refresh circuit is provided which obviates the need for a conventional clock generator, and thus, is simpler and relatively smaller in size. Rather, in the preferred refresh circuit, the timing is generated directly from the internal voltage supply. The principle of operation is as follows: during the sleep mode, the switch connecting the major supply to the local supplies is turned off. The local supply level floats and the voltage gradually falls as millions of the cells are simultaneously leaked. When a predetermined low voltage on the local supply is detected, the switches that join the internal supply to the external supply (Vdd) are activated to increase the voltage level of the internal supply (a refresh period). When the predetermined high level is detected, the switch is turned off, and the local supplies become floating again. The waveforms of the local supply voltages during sleep mode are as shown in FIG. 6(a). FIG. 6(b) depicts the sleep mode control signal 320' and the FIG. 6(c) depicts the pulsed refresh waveform 330 having a typical floating period of about 1 $\mu$s, for example, and a refresh period of about 10 ns, for example. Depending upon the desirable high and low level, the refresh timing may be different.

Figure 7:
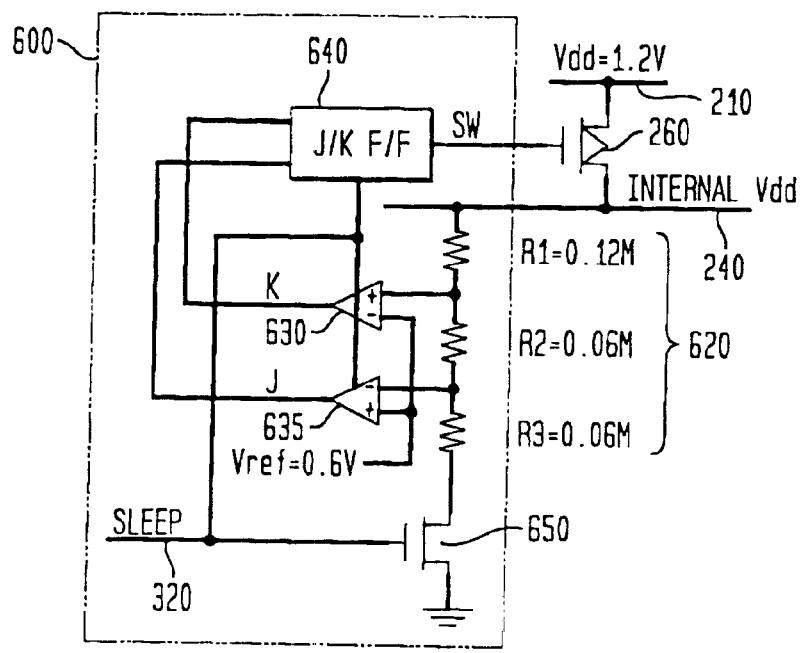
FIG. 7 illustrates a circuit schematic of a refresh control circuit 600 according to a preferred embodiment of the invention.

A simple circuit schematic of a refresh control circuit 600 according to a preferred embodiment is shown in FIG. 7. As shown, refresh control circuit 600 comprises a voltage divider component 620, first and second low-power differential amplifiers 630, 635 connected at respective different nodes of the voltage divider component 620, and a flip-flop device such as J-K flip-flop 640. In order to keep the power overhead of the control circuit to be less than 10 uA, the voltage divider circuit is comprised of high value resistors (e.g., in the range of Mohm). In an example embodiment depicted in FIG. 7, the voltage divider component 620 includes three resistors R1–R3 connected in serial with resistance values of 0.12 Mohm, 0.06 Mohm and 0.06 Mohm, respectively. The first node of the first resistor is connected to an internal power supply 240. The second node of the first resistor R1 is connected to the first node of the second resistor R2 and the first input of the first differential amplifier 630. The second node of the second resistor R2 is connected to the first node of the third resistor R3, and the first input of the second differential amplifier 635. A reference voltage, Vref, of approximately 0.6 V, for example, is connected to the second inputs of each of the first and the second differential amplifiers. The second node of the third resistor R3 is connected to the drain of a nMOS device 650 with the source of the NMOS device 650 connected with ground. The output of the first differential amplifier 630 is input to the "J" input of a J-K flip-flop 640 and the output of the second differential amplifier 635 is input to the "K" input of the J-K flip-flop. The inverted output of the J-K flip-flop is connected with the switch 260 connected between the major power supply Vdd 210 to the internal (local) power supply 240.

The resistors R1–R3 are used to set the high-voltage level (Vh) and low- voltage level (Vl) of the local supply. For example, values of Vdd=1.2V with the high level being set at Vh=0.6V and low-level being set at Vl=0.3V may be used. The local supply may be set at such a low range is to ensure that array leakage is minimal, since I=V/R. If V is small, the DC leakage current "I" will also be small, accordingly. However, it is understood that the low level may not be too low, or the data stored in the cells may be lost due to noise. As further shown in FIG. 7, it is noted that a sleep control signal 320 is presented to activate the refresh circuit 600. When the sleep is over, all the refresh components are disabled.

Figure 8:
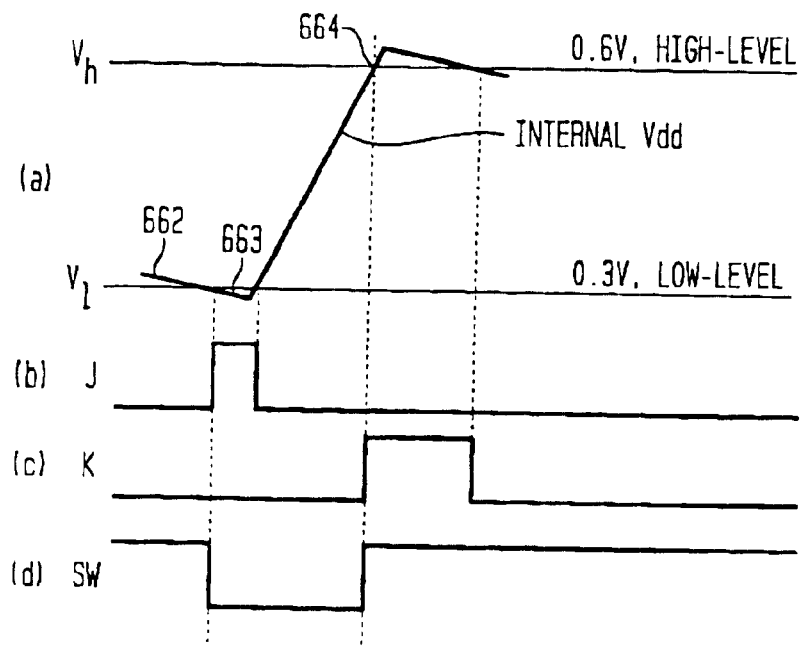
FIGS. 8(a)–8(d) illustrate various voltage waveforms corresponding to the refresh circuit of FIG. 7.

FIGS. 8(a)–8(d) illustrate various voltage waveforms corresponding to the refresh circuit of FIG. 7. As shown in FIG. 8(a), when the internal voltage supply voltage 662 is lower than 0.3V, the second differential amplifier 635 will activate to reset the J input (FIG. 8(b)) causing the output switch to 260 to turn on (FIG. 8(d)) and enabling the internal Vdd voltage to rise. More specifically, as shown in FIG. 8(a), when the low level is reached, some over-shooting 663 occurs due to the relatively slow response time of the low-power differential amplifier and low-power voltage divider. At this moment, the second differential amplifier will swing, creating the "J" pulse which forces the negative output of the J-K flip-flop to engage the switch. The falling edge of the J pulse is caused by the detection of the low-level has reached, and has no effect on the J-K flip-flop. Consequently, the switch is maintained on as shown in FIG. 8(d). Similarly, when the internal voltage supply voltage 662 reaches the Vh level of about 0.6V at 664, the first differential amplifier 630 is activated to reset the K input (FIG. 8(c)) causing the output switch to 260 to turn off (FIG. 8(d)) and enabling the internal Vdd voltage to float. Thus, after a certain overshooting 664, the local supply is reduced to below the high level since the switch is shut off. More specifically, as shown in FIG. 8(a), the second differential amplifier first is turned on when the high-level is reached which creates the rising edge of the "K" pulse which, in turn, forces the negative output of the J-K flip-flop to disengage the switch 260 (FIG. 7). When the switch is off, the voltage will drop from an overshot level back to below the high level, which will trigger the second differential amplifier off. This has no effect on the J-K flip-flop and the switch is maintained off until the voltage falls below the low level at which time the cycle again will start.

Figure 9:
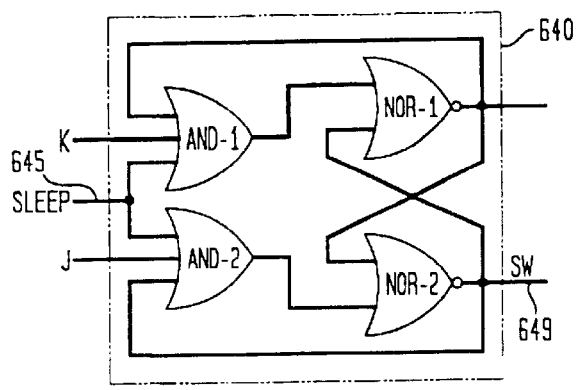
FIG. 9 illustrates in greater detail a J-K flip-flop provided with a sleep control input for use in the refresh control circuit of the invention.

FIG. 9 illustrates in greater detail the J-K flip-flop 640 which is shown as provided with a sleep control input 645 that functions to disable the flip-flop. Particularly, as shown in FIG. 9, the J-K flip-flop 640 comprises two AND gates, i.e. AND-1 and AND-2, and two NOR gates, i.e. NOR-1 and NOR-2 in the configuration shown, as known in the art, with the negative output of the flip-flop 649 being used to switch the pMOS device, according to the invention.

In an example implementation, wherein the dynamic refresh scheme according to the preferred embodiment (FIG. 7) is used in a 4M SRAM implementation, the array leakage was measured to be about 51.2 uA when the Vh level of the internal supply was set at 0.7V and Vl level was set at 0.35V. With the power consumption from the refresh control circuit being about 12 uA, the total average stand-by power is about 63.2 $\mu$A comparing to that of the conventional array of 416 $\mu$A, enabling even more significant power reduction savings.

Figure 10:
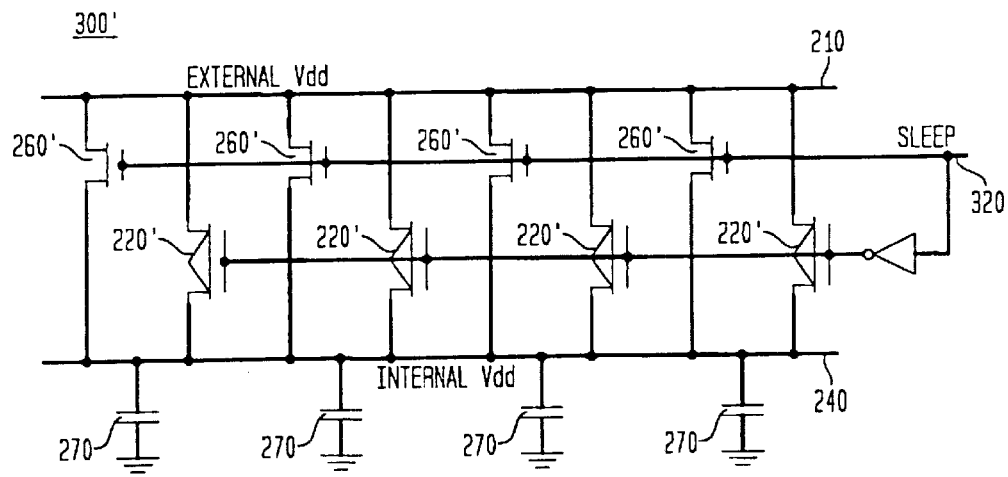
FIG. 10 illustrates a circuit schematic of a refresh control circuit 200' implementing a voltage clamp technique according to another preferred embodiment of the invention.
Figure 11A:
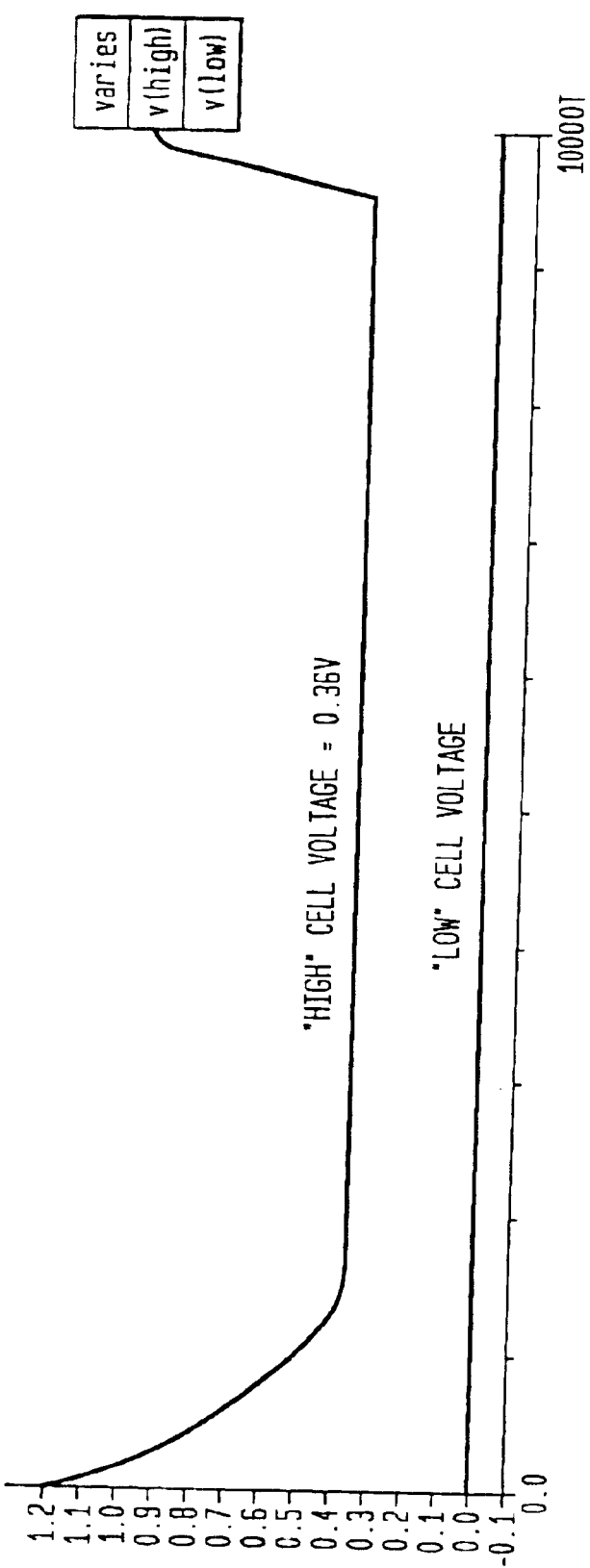
FIG. 11(a) illustrates voltage waveforms of the refresh control circuit 200' implementing the voltage clamp technique and FIG. 11(b) illustrates a corresponding voltage supply current waveform for the voltage clamp refresh circuit.
Figure 11B:
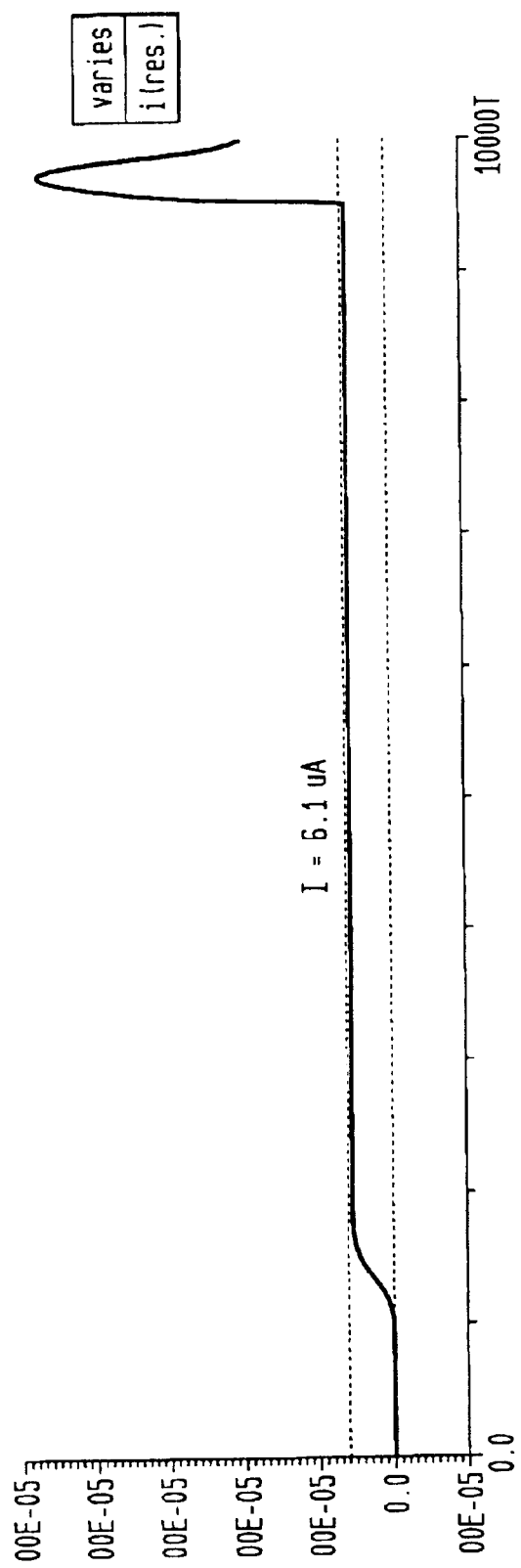

It is desirable to further simplify operation of the power management control circuit to achieve even further power saving and reduce semiconductor real estate. Thus, in a second embodiment, the power management circuit 300' is implemented with a static clamp mechanism for clamping the low level of the internal supply at a desirable low level, e.g., to about 0.3Vdd. The control circuit 300' as shown in FIG. 10 corresponds to the circuit of FIG. 2, however, implements a small, high-threshold voltage nMOS device 260' having Vth in the range from about 0.6V to about 0.8 V as the switch during sleep mode. In the active mode, these nMOS switches 260' are turned off, and, the larger pMOS transistor switches 220' are turned on to reduce the on resistance to the power supply line 210. While in the sleep mode, the nMOS switch 260' is on so that the internal voltage level is clamped roughly at a voltage corresponding to Vdd−Vthn, where Vthn is the threshold voltage of the nMOS device 260'. Assuming a large SRAM array, several nMOS switches may be needed in order to evenly feed the current to the array. When implementing the circuit of FIG. 10 in a SRAM array, the "high" node voltage of the SRAM cell is first dropped from Vdd to Vdd−Vthn, or about 0.36V, when entering the sleep mode as shown in FIG. 11(a). This level is recovered back to Vdd when the sleep mode is over. As shown in FIG. 11(b), during the simulation, the average current from power supply after switching from low-resistance pMOS switch to the high-resistance high-Vt NMOS switch caused by array leakage is about 6.1 $\mu$A. The voltage is maintained at a low level 0.36V clamped by the NMOS device during the period of sleep. When the sleep is over, a 500 ns "soft-recover" period is provided to allow the cells to be restored to the full level. This soft recovery period is important in order to avoid any disturbance to the array. The average stand-by current for a 4M SRAM including the recovery current is about 97.6 uA, however no complex control circuit is needed for this approach.

This invention has great potential to be used to save power in many products using SRAM/logic technologies. The products can range from high performance servers, PC's such as the IBM PowerPC, workstations as well as portable system for pervasive and wireless applications.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A semiconductor static random access memory (SRAM) system including one or more memory arrays, said system comprising;
   a power management device associated with each memory array, each power management device comprising a first switching device for connecting an external Power source to a memory array during normal SRAM device operation and responsive to a low power mode signal for disconnecting said external power source from said memory array during a low power mode of operation; said power management device further comprising a second switching device for connecting said external power source to a local power source associated with each respective memory array, and,
   a refresh control device for independently controlling each said second switch device for selectively connecting and disconnecting said external power source to said local power source associated with a respective memory array for refreshing said associated local power source during said low power mode of operation, whereby power consumption in said SRAM device is reduced during said low power mode.

2. The SRAM system as claimed in claim 1, wherein said first and second switch devices are MOS devices, said second switch device being smaller than said first switch device for slow switching during said low power mode.

3. The SRAM system as claimed in claim 1, wherein said refresh control device generates a periodic pulsed refresh control signal for periodically switching said external power source to a respective local power supply.

4. The SRAM system as claimed in claim 1, wherein said refresh control device simultaneously generates one or more pulse control signals fir enabling simultaneous switching of each second switch device for connecting said external power source to each said local power source for powering each memory array during the low-power mode.

5. The SRAM system as claimed in claim 1, wherein said refresh control device sequentially generates one or more pulse control signals for connecting said external power source to a respective local power supply of a memory array in a sequential manner during the low-power mode.

6. The SRAM system as claimed in claim 1, wherein said refresh control device includes a mechanism for sensing a voltage of said local power supply during the low-power mode, wherein upon sensing of a local supply voltage level lower than a predetermined low-level voltage, said refresh control device activating said second switch to connect the external power supply to a respective local supply to thereby increase its voltage level.

7. The SRAM system as claimed in claim 6, wherein upon sensing of the local supply voltage level at a level higher than a predetermined high-level, said refresh control device de-activating said second switch to disconnect the external power supply from the local supply to thereby decrease its voltage level due to sub-array memory cell charge leakage.

8. The SRAM system as claimed in claim 7, further comprising a reservoir capacitor connected to a respective local power supply for replenishing any the leakage charge to the SRAM arrays.

9. The SRAM system as claimed in claim 7, wherein said generated pulsed refresh control signal has a pulse width ranging from 1 nsec to 100 nsec.

10. The SRAM system as claimed in claim 7, wherein said refresh control device comprises a timer circuit for generating said pulsed refresh control signal.

11. The SRAM system as claimed in claim 3, wherein said refresh control device further comprises a decoder device responsive to a control signals for indicating a specific memory array to be refreshed.

12. The SRAM system as claimed in claim 2, wherein said first switch device is a low resistance switch for operation during said active mode, and said second switch device is a high resistance switch to ensure a soft-refresh during said low power mode.

13. The SRAM system as claimed in claim 12, wherein said first switch device is a wide channel MOS transistor device having a channel width ranging anywhere from about 100 $\mu$m–5000 $\mu$m.

14. The SRAM system as claimed in claim 12, wherein said second switch device is a narrow channel MOS transistor device having a channel width ranging anywhere from about 1 $\mu$m–5 $\mu$m.

15. The SRAM system as claimed in claim 12, wherein said second switch device is a high-threshold voltage nMOS device having a threshold voltage ranging anywhere from about 0.6 V to 1V, wherein during said low-power mode, said second switch device functions to clamp said local supply level.

16. The SRAM system as claimed in claim 12, wherein said first switch device is a low-threshold voltage pMOS device having a threshold voltage ranging anywhere from about 0.3 to 0.6V.

17. The SRAM system as claimed in claim 7, wherein a refresh cycle time period for a memory array ranges from about 1 $\mu$sec to 5 $\mu$sec.

18. The SRAM system as claimed in claim 7, wherein said predetermined high-level of the local power supply voltage ranges anywhere between 0.6 V to 1 V and said predetermined low-level of the local power supply voltage ranges from 0.2 V to 0.4 V.

19. The SRAM system as claimed in claim 6, wherein said sensing mechanism includes:
   a first comparing device for comparing said sensed local power supply level against said predetermined high-level voltage;
   a second comparing device for comparing said sensed local power supply level against said predetermined low-level voltage, each of said comparing devices connected with said
   means responsive to said first and second comparing devices for one of: respectively deactivate and activate said second switch device for respectively disconnecting said external power supply from said local supply or connecting said external power supply to said local supply.

20. The SRAM system as claimed in claim 19, wherein said means responsive to said first and second comparing devices includes a flip-flop device.

21. The SRAM system as claimed in claim 1, further comprising ground wiring provided to shield noise among said one or more memory arrays.

22. A power management circuit for an SRAM system including one or more memory arrays and implementing a power source including a local power supply associated with each memory array and an external power supply connected to each local power supply during active mode of operation, said power management circuit comprising:
   a switch mechanism for disconnecting the external power supply to each said at least one local power supply during a low power mode of operation; and, a refresh timing circuit implementing memory cell refresh operation by selectively connecting the external power supply to a respective local power supply during said low power mode, wherein, during said low power mode, said refresh circuit intentionally enables said local power supply to float and drift to a lower predetermined voltage level prior to said memory array refresh operation.

23. A power management circuit for an SRAM system including one or more memory arrays and implementing a power source including a local power supply associated with each memory array and an external power supply connected to each local power supply during active mode of operation, said power management circuit comprising:

a first switch mechanism for disconnecting the external power supply to each said at least one local power supply during a low power mode of operation; and, a refresh timing circuit implementing a voltage clamp device for clamping said each respective local power supply at a predetermined voltage during said low power mode, said predetermined voltage being lower than said external supply voltage.

24. The power management circuit for an SRAM device as claimed in claim 23, wherein said first switch mechanism and said voltage clamp device are responsive to a low power mode control signal for initiating said lower power mode.

25. The power management circuit for an SRAM device as claimed in claim 23, wherein said voltage clamp device includes a high-threshold voltage MOS transistor device having a threshold voltage ranging anywhere from about 0.6 V to 1 V.

26. The power management circuit for an SRAM device as claimed in claim 23, wherein said first switch device is a low-threshold voltage MOS transistor device having a threshold voltage ranging anywhere from about 0.3 to 0.6V.

\* \* \* \* \*

UNITED STATES PATENT AND TRADEMARK OFFICE
CERTIFICATE OF CORRECTION

PATENT NO.    : 6,434,076 B1
DATED         : August 13, 2002
INVENTOR(S)   : John Anderson et al.

It is certified that error appears in the above-identified patent and that said Letters Patent is hereby corrected as shown below:

Column 3,
Line 50, "army" should read -- array --

Column 4,
Line 5, "232,233" should read -- 232, 233 --

Column 9,
Line 38, "fir" should read -- for --.
Line 48, "a mechanism" should read -- a sensing mechanism --
Line 65, "claim 7" should read -- claim 3 --

Column 10,
Line 1, "claim 7" should read -- claim 3 --
Line 30, "claim 7" should read -- claim 3 --

Signed and Sealed this

Sixth Day of January, 2004

JAMES E. ROGAN
*Director of the United States Patent and Trademark Office*